United States Patent [19]
Gillette

[11] Patent Number: 6,008,683
[45] Date of Patent: Dec. 28, 1999

[54] SWITCHABLE LOAD FOR TESTING A SEMICONDUCTOR INTEGRATED CIRCUIT DEVICE

[75] Inventor: Garry C. Gillette, San Jose, Calif.

[73] Assignee: Credence Systems Corporation, Fremont, Calif.

[21] Appl. No.: 08/962,051

[22] Filed: Oct. 31, 1997

[51] Int. Cl.$^6$ .................................................. H03K 17/64
[52] U.S. Cl. .......................... 327/404; 327/308; 327/334; 327/437; 326/34
[58] Field of Search .................................. 327/308, 334, 327/404, 434, 437; 326/30, 34

[56] References Cited

U.S. PATENT DOCUMENTS

| | | | |
|---|---|---|---|
| 4,500,845 | 2/1985 | Ehni | 330/86 |
| 4,855,685 | 8/1989 | Hochschild | 330/282 |
| 5,117,130 | 5/1992 | Shoji | 326/34 |
| 5,162,672 | 11/1992 | McMahan et al. | 326/86 |
| 5,194,765 | 3/1993 | Dunlop et al. | 326/87 |
| 5,254,883 | 10/1993 | Horowitz et al. | 326/30 |

*Primary Examiner*—Terry D. Cunningham
*Attorney, Agent, or Firm*—Smith-Hill and Bedell

[57] ABSTRACT

A loading device for use in a tester for testing a semiconductor integrated circuit device (DUT) includes a programmable voltage source for providing a selected voltage at an output terminal thereof and multiple resistive elements each having at least a first state, in which the resistive element is conductive, and a second state, in which the resistive element is substantially non-conductive. The resistive elements are connected as a two-terminal network between the output terminal of the programmable voltage source and a tester pin for connection to a pin of the DUT. A selection device selects the state of each resistive element, whereby the resistance between the output terminal of the programmable voltage source and the tester pin can be selectively varied.

16 Claims, 2 Drawing Sheets

6,008,683

1

SWITCHABLE LOAD FOR TESTING A SEMICONDUCTOR INTEGRATED CIRCUIT DEVICE

BACKGROUND OF THE INVENTION

This invention relates to a switchable load for testing a semiconductor integrated circuit device.

Frequently the specifications for a semiconductor integrated circuit device define performance of the device by reference to a pin, when operating as an output, being connected through a specified resistive load to a specified voltage. It would be desirable in testing of an integrated circuit device to be able to load an output pin of the device under test (DUT) in this manner, but the value of the specified load resistance can vary widely from device to device, and it may be specified with a high degree of precision. A suitable resistive load could be realized by arranging fixed resistors in a relay-switched resistor network, allowing a single resistor to be selected for a given test, but since the value of the resistance can vary widely, a large number of resistors would be required. It has not been economical to provide a load of this nature because of the considerable space occupied by the resistors and the power consumed in controlling the switches. In addition, the load resistor must be out of circuit in a test cycle in which the pin operates as an input to the DUT, which requires that a low resistance switch be inserted in series between the relay-switched resistor network and the DUT pin and that the switch be operated very rapidly, typically in less than 100 ns.

One compromise solution to the problem of providing the proper resistive load has employed a diode bridge connected to a programmable current source, in which the DUT output provides the commutating voltage for the diode switches. This approach is subject to disadvantage because it does not provide a resistive termination for the interconnect cable to the DUT and only meets the specified load conditions at two voltage-current points. Other solutions have been to provide a third voltage level to which the test system driver could be switched. This typically would provide a fixed 50 ohm value of load resistance, and the switching time could be controlled by the driver I/O timing. This solution offers only one value of load resistance and typically does not test the DUT at its specified load conditions.

SUMMARY OF THE INVENTION

In accordance with a first aspect of the invention there is provided a loading device for use in a tester for testing a semiconductor integrated circuit device (DUT), the loading device including a programmable voltage source for providing a selected voltage at an output terminal thereof, a plurality of resistive elements each having at least a first state, in which the resistive element is conductive, and a second state, in which the resistive element is substantially non-conductive, and wherein the resistive elements are connected as a two-terminal network between the output terminal of the programmable voltage source and a tester pin for connection to a pin of the DUT, and a selection means for selecting the state of each resistive element, whereby the resistance between the output terminal of the programmable voltage source and the tester pin can be selectively varied.

In accordance with a second aspect of the invention there is provided a loading device for use in a tester for testing a semiconductor integrated circuit device (DUT), the loading device including a programmable voltage source for providing a selected voltage at an output terminal thereof, a plurality of CMOS transmission gates each having an

2 enabled state, in which it is conductive, and a disabled state, in which it is substantially non-conductive, and wherein the transmission gates are connected as a two-terminal network between the output terminal of the programmable voltage source and a tester pin for connection to a pin of the DUT, and a selection means for selecting the state of each transmission gate, whereby the resistance between the output terminal of the programmable voltage source and the tester pin can be selectively varied.

BRIEF DESCRIPTION OF THE DRAWINGS

For a better understanding of the invention, and to show how the same may be carried into effect, reference will now be made, by way of example, to the accompanying drawings, in which.

DETAILED DESCRIPTION

Figure 1:
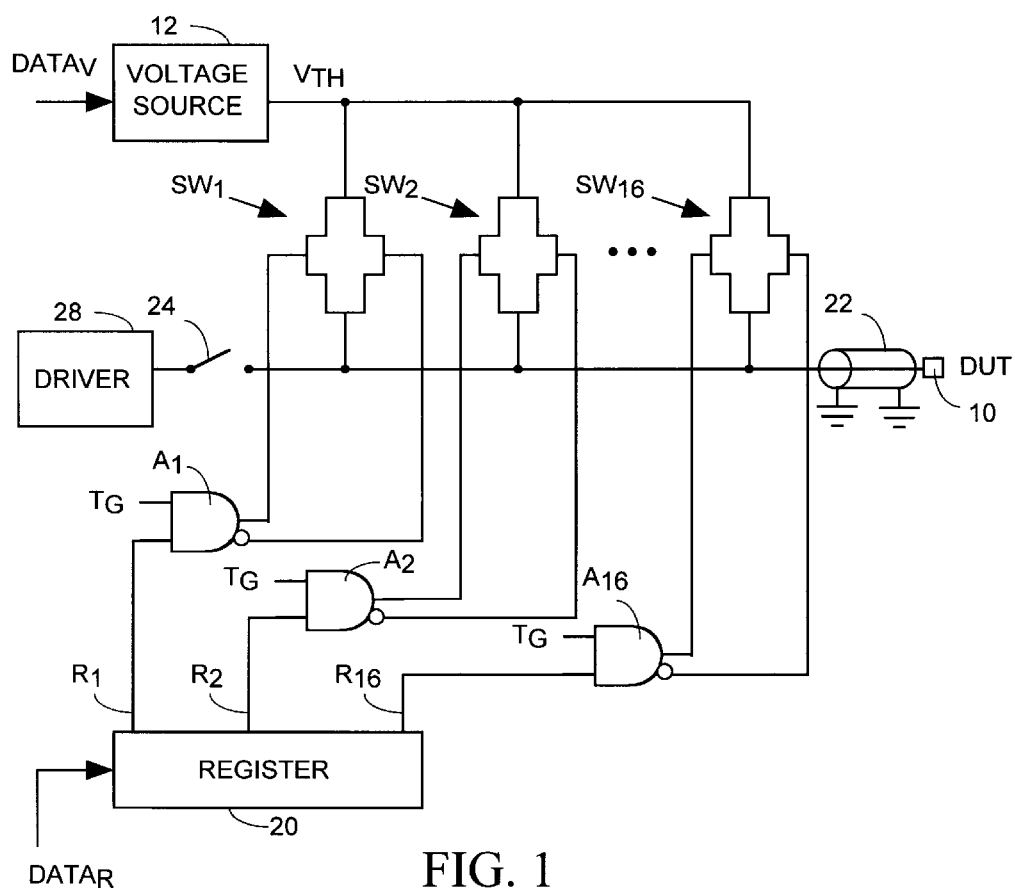
FIG. 1 is a schematic diagram of a first loading device in accordance with the present invention.

The loading device shown in FIG. 1 is designed for testing a memory device.

Referring to FIG. 1, a data word DATA, is supplied to a programmable voltage source 12, such as an operational amplifier driven by a digital-to-analog converter, for setting the output voltage $V_{TH}$ of the voltage source. A pin 10 of the DUT is connected to the voltage source 12 through a load resistor constituted by an arrangement of sixteen paralleled switches $SW_1$–$SW_{16}$ fabricated in an integrated circuit die using CMOS technology. Each switch SW has an enabled, or closed, state in which it is conductive and a disabled, or open, state in which it is non-conductive and may be implemented by a CMOS transmission gate (T-gate). Each switch has two control gate terminals and is enabled when one terminal is high and the other terminal is low, and is disabled when the terminals are in the opposite respective states. The sixteen switches are of binary weighted conductance, such that the conductance of the switch $SW_1$, when enabled, is twice that of the switch $SW_2$, which in turn is twice that of the switch $SW_3$, and so on. This provides $2^{16}$ selectable resistance values. The combination in which the switches SW are enabled determines the value of the resistance $R_{load}$ between the DUT pin 10 and the voltage $V_{TH}$ supplied by the voltage source 12.

Sixteen AND gates $A_1$–$A_{16}$ and a register 20 storing a data word $DATA_R$ composed of sixteen binary values $R_1$–$R_{16}$ are integrated in the same die as the sixteen switches $SW_1$–$SW_{16}$. Each AND gate $A_i$ (i=1 . . . 16) has one input connected to an output of the register 20 and a second input connected to receive a timing signal $T_G$, which is distributed to all the AND gates. The timing signal $T_G$ is in the logic one state when the DUT pin 10 is to be connected to the programmed voltage $V_{TH}$ through the programmed resistance $R_{load}$ and is otherwise in the logic zero state. Each AND gate $A_i$ has one (non-inverted) output connected to one terminal of the switch $SW_i$ and a second (inverted) output connected to the other terminal of the switch. In this manner, the AND gate $A_i$ controls the state of the switch $SW_i$ depending on the value $R_i$.

A data word $DATA_R$ is loaded into the register 20. The resistance value $R_{load}$ of the switches $SW_1$–$SW_{16}$ is established by the value of the word $DATA_R$. If, for example, the switches $SW_1$ and $SW_2$ only are to be enabled and the other switches $SW_3$–$SW_{16}$ are to be disabled, the register 20 is loaded with the data word (1, 1, 0, 0, . . . , 0). In this case, the outputs $R_1$ and $R_2$ of the register are in the logic one state and the other outputs $R_3$–$R_{16}$ are in the logic zero state. When the timing signal $T_G$ is high, the switches $SW_1$ and $SW_2$ are closed (conductive) and the switches $SW_3$–$SW_{16}$ are open (non-conductive)

The typical range of the resistance $R_{load}$ is 50–5000 ohms and a typical range of $V_{TH}$ is 1–2 volts. The typical output voltage levels of the pin 10 are between 0.4 and 2.4 volts. In the event that $R_{load}$ is 100 ohms, the maximum power dissipation is about 50 mW, which is less than one-tenth of the dissipation in the conventional load circuit.

In the event that the output signal at the DUT pin 10 has high frequency components, such that it is desirable to employ a transmission line 22 for connecting between the load device and the DUT pin and the desire to avoid degradation of the signal by reflections outweighs the need for the resistance $R_{load}$ to match accurately the specified value, the value $DATA_R$ may be selected to set the switches SW to provide the proper resistance value to terminate the transmission line. In this case, the value $DATA_V$ may be selected to set the voltage $VT_H$ at a fixed level, which is typically between the specified output high and output low voltage levels at the DUT pin 10.

The data values $DATA_R$ are calibrated by connecting an external parametric measurement unit (PMU) to the DUT pin 10 and forcing a current while measuring the voltage at the DUT pin. A table relating voltage and current points to values of $DATA_R$ is created and the value that fits most closely to the specified point is selected and loaded into the register 20.

The pin 10 may also be connected through a switch 24 to a driver 28. In the event the pin 10 is to operate as an input, the switches SW are disabled and the switch 24 is closed to connect the driver 28 to the pin 10 for driving the pin to a high or low voltage.

In some cases, the specifications of the DUT might define two states of the pin 10 when operating as an output, requiring an output high current $I_{OH}$ at an output high voltage $V_{OH}$ and an output low current $I_{OL}$ at an output low voltage $V_{OL}$. A single combination of values of $V_{TH}$ and $R_{load}$ can provide both the output low current $I_{OL}$ when the pin 10 is at the output low voltage $V_{OL}$ and the output high current $I_{OH}$ when the pin is at the output voltage $V_{OH}$.

Figure 2:
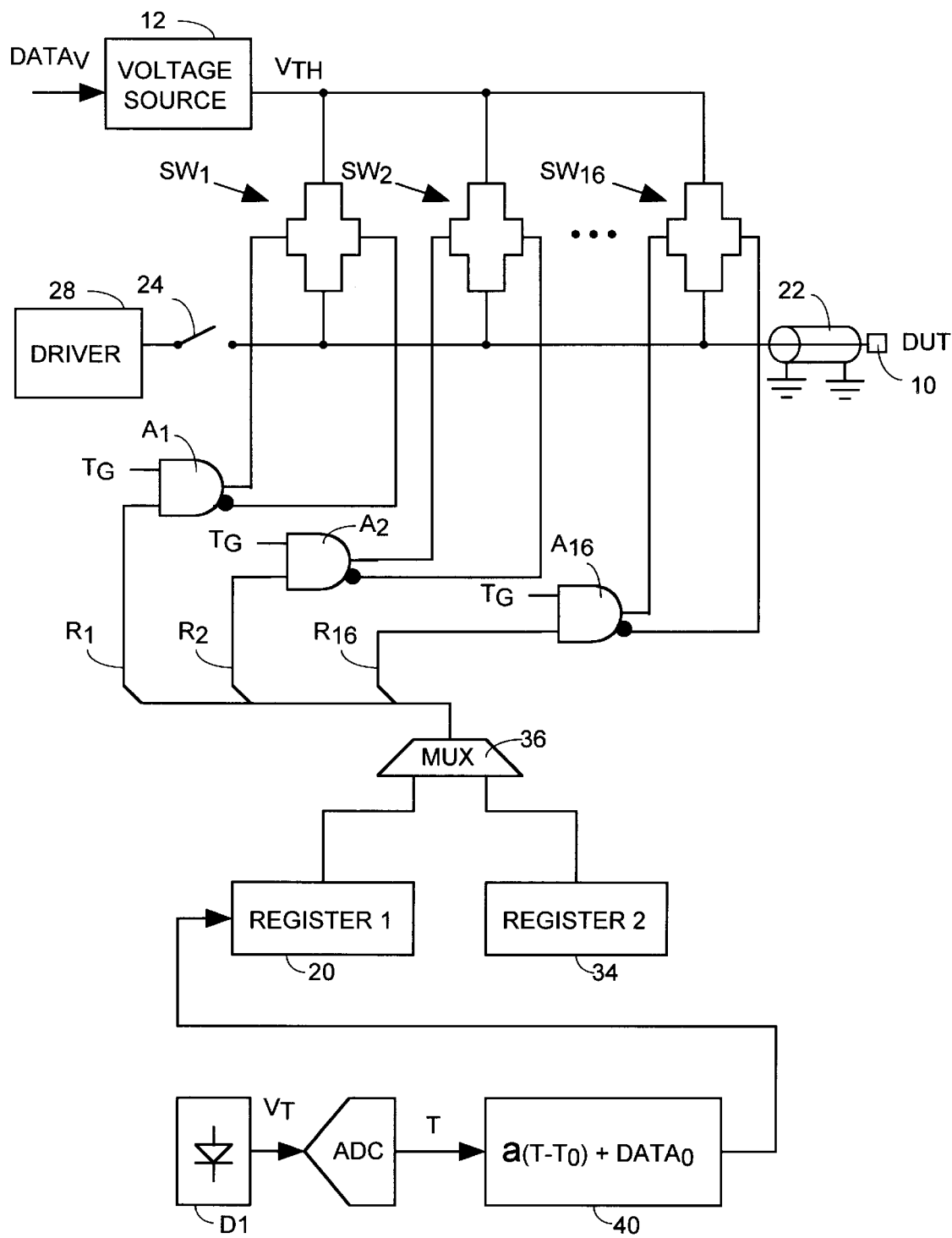
FIG. 2 is a schematic diagram of a second loading device in accordance with the present invention.

The resistance of the CMOS switches $SW_1$–$SW_{16}$ will vary as a function of temperature, typically increasing 1% per degree C. over a fairly wide range of temperatures. Accordingly, a change in temperature of the integrated circuit die in which the switches are fabricated will have a significant effect on the load resistance of a given combination of switches SW. Referring to FIG. 2, a diode D1 is formed in the same integrated circuit die as the switches SW and can be used to generate a voltage signal which is proportional to temperature. If the data value to be stored in the register 20 to achieve a desired resistance value is calibrated at a temperature $T_0$, at which the voltage signal provided by the diode has a value $V_0$, then the data value required to program the register during operation at a temperature T, at which the voltage signal provided by the diode has a value $V_T$ can be expressed as $$DATA_R=a(T-T_0)+DATA_0$$

where a is a constant.

In order to compensate for the effect of temperature on load resistance, the voltage signal provided by the diode D1 is converted to digital form and is used as one input to a mathematical function 40, such as a look-up table, which receives the value $DATA_0$ as another input and returns the value $DATA_R$. In this manner, the resistance value of the switches $SW_1$–$SW_{16}$ is rendered independent of temperature.

In another modification shown in FIG. 2, an additional control register 34 containing a preset value is formed in the same integrated circuit die as the register 20 and a 2×1 multiplexer 36 is connected between the outputs of the registers 20 and 34 and the inputs of the AND gates A1–A16. The multiplexer 36 is controlled by a control signal so that either the program register 20 or the control register 34 is selected for providing the data word that selects the pattern in which the switches $SW_1$–$SW_{16}$ are to be enabled. By using the multiplexer to switch from the program register 20 to the control register 34, the preset value in the control register can be selected without it being necessary to halt the test sequence and reload the program register 20, which is advantageous because reloading time is much longer than a cycle time.

The value to be stored in the control register 34 is calibrated by connecting an external parametric measurement unit to the DUT pin 10 and forcing a selected current while measuring the voltage at the DUT pin. The value stored in the program register 20 is adjusted to achieve the closest fit to a desired current-voltage point, and this register value is then stored in the control register 34. The value to be stored in the control register 34 may be adjusted to compensate for temperature effects in response to the voltage signal provided by the diode D1, in similar fashion to the manner in which the value stored in the register 20 is adjusted.

Subject matter disclosed in this application is related to subject matter disclosed and claimed in patent application Ser. No. 08/962,050 which is U.S. Pat. No. 5,959,890, the entire disclosure of each of which is hereby incorporated by reference herein.

It will be appreciated that the invention is not restricted to the particular embodiments that have been described, and that variations may be made therein without departing from the scope of the invention as defined in the appended claims and equivalents thereof. For example, although the invention has been described with reference to implementation in CMOS technology, it would be equally applicable in other technologies allowing fabrication of transfer gate switches, such as GaAs. Use of GaAs would provide the advantage of faster switching times at lower values of $V_{TH}$.

I claim:

1. A loading device for testing a semiconductor integrated circuit device under test (DUT), wherein said DUT includes a DUT terminal for receiving an input signal having high and low logic levels and for alternatively transmitting an output signal having high and low logic levels generated by the DUT, the loading device comprising:

driver means connected to said DUT terminal for supplying said input signal of said high logic level when the DUT is to receive an input signal of high logic level, for supplying said input signal of said low logic level when the DUT terminal is to receive an input signal of low logic level, and for tristating the DUT terminal when the DUT generates said output signal;

a programmable voltage source for providing a selected voltage at an output terminal thereof;

a plurality of resistive elements each having at least a first state in which the resistive element is conductive and a second state in which the resistive element is substantially non-conductive, and wherein the resistive elements are connected as a two-terminal network between the output terminal of the programmable voltage source and said DUT terminal; and selection means for selecting the state of each resistive element, whereby the resistance between the output terminal of the programmable voltage source and the DUT terminal can be selectively varied.

2. A loading device according to claim 1 wherein the resistive elements are connected in parallel between the output terminal of the programmable voltage source and said DUT terminal.

3. A loading device according to claim 1 wherein the resistive elements are of differing respective conductances in the first state.

4. A loading device according to claim 3 wherein the conductances of the resistive elements are in binary weighted relationship.

5. A loading device according to claim 1 wherein said selection means comprises:

a register for storing a data word specifying the state of each resistive element, and combinational logic means responsive to a timing signal for utilizing the data word stored in the register to place the resistive elements in the specified states respectively.

6. A loading device according to claim 1 wherein said resistive elements are transistors implemented in an integrated circuit, and wherein said selection means comprises means for sensing a temperature of the integrated circuit and for selecting the state of each resistive element in accordance with said temperature.

7. A loading device according to claim 1 wherein said selection means comprises:

register means for storing a first data word and a second data word, multiplexer means for selecting one of the first and second data words, and combinational logic means for selecting the state of each resistive element in accordance with the one of said first and second data words selected by said multiplexer means in response to a timing signal.

8. A loading device according to claim 1 wherein said driver means comprises:

a driver for generating an output signal selectively of high and low logic levels, and means for selectively connecting said driver output signal to said DUT terminal.

9. A loading device for testing a semiconductor integrated circuit device under test (DUT), wherein said DUT includes a DUT terminal for receiving an input signal having high and low logic levels and for alternatively transmitting an output signal having high and low logic levels gene rated by the DUT, the loading device comprising:

driver means connected to said DUT terminal for supplying said input signal of said high logic level when the DUT is to receive an input signal of high logic level, for supplying said input signal of said low logic level when the DUT terminal is to receive an input signal of low logic level, and for tristating the DUT terminal when the DUT generates said output signal;

a programmable voltage source for providing a selected voltage at an output terminal thereof;

a plurality of transmission gates each having an enabled state in which it is conductive and a disabled state in which it is substantially non-conductive, and wherein the transmission gates are connected as a two-terminal network between the output terminal of the programmable voltage source and the DUT terminal, and selection means for selecting the state of each transmission gate, whereby the resistance between the output terminal of the programmable voltage source and the tester pin can be selectively varied.

10. A loading device according to claim 9 wherein the transmission gates are connected in parallel between the output terminal of the programmable voltage source and the DUT terminal.

11. A loading device according to claim 9 wherein the transmission gates are of differing respective conductances in the enabled state.

12. A loading device according to claim 11 wherein the conductances of the transmission gates are in binary weighted relationship.

13. A loading device according to claim 9 wherein said selection means comprises:

a register for storing a data word specifying the state of each transmission gate, and combinational logic means responsive to a timing signal for selecting said state of each transmission gate to a state specified by the data word stored in said register in response to the timing signals.

14. A loading device according to claim 13 wherein said transmission gates are transistors implemented in an integrated circuit, and wherein said selection means comprises means for sensing a temperature of the integrated circuit and for selecting the state of each transmission gate in accordance with said temperature.

15. A loading device according to claim 9 wherein said selection means comprises:

register means for storing a first data word and a second data word, control register for storing a control data word specifying a second combination of states of the transmission gates, multiplexer means for selecting one of the first and second data words stored in said register means, and combinational logic means responsive to a timing signal for utilizing the selected one of said first and second data words to place the transmission gates in a combination of states specified thereby.

16. A loading device according to claim 9 wherein said driver means comprises:

a driver for generating an output signal selectively of high and low logic levels, and means for selectively connecting said driver output signal to said DUT terminal.

* * * * *